(12) United States Patent
Baumann

(10) Patent No.: US 8,896,978 B2
(45) Date of Patent: Nov. 25, 2014

(54) INTEGRATED CIRCUIT WITH AUTOMATIC DEACTIVATION UPON EXCEEDING A SPECIFIC ION LINEAR ENERGY TRANSFER (LET) VALUE

(75) Inventor: Robert Christopher Baumann, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 13/523,989

(22) Filed: Jun. 15, 2012

(65) Prior Publication Data
US 2013/0335875 A1  Dec. 19, 2013

(51) Int. Cl.
*H02H 3/22* (2006.01)

(52) U.S. Cl.
USPC ......................................... 361/93.1

(58) Field of Classification Search
USPC .................. 361/93.1; 307/130, 131
See application file for complete search history.

(56) References Cited

U.S. PATENT DOCUMENTS

| | | | |
|---|---|---|---|
| 5,315,544 A | 5/1994 | Yokote et al. | |
| 6,064,555 A * | 5/2000 | Czajkowski et al. | 361/111 |
| 6,441,440 B1 | 8/2002 | Brady et al. | |
| 7,880,340 B2 | 2/2011 | Miller | |
| 8,084,342 B2 | 12/2011 | Snyder et al. | |
| 2003/0056160 A1 * | 3/2003 | Kohnen et al. | 714/718 |
| 2006/0150128 A1 | 7/2006 | Zhu et al. | |
| 2007/0157349 A1 | 7/2007 | Zhu et al. | |
| 2008/0266734 A1 * | 10/2008 | Miller | 361/78 |
| 2012/0054570 A1 * | 3/2012 | Lillestolen | 714/746 |

OTHER PUBLICATIONS

Texas Instruments, "AN-989 Single Event Upset and Latchup Considerations for CMOS Devices Operated at 3.3 V", 2011.*
Barak et al. "Detecting Heavy Ions and Protons in Space: Single-Events Monitor", Electrical and Electronics Engineers in Israel, 1995.*
Johnston et al. "The Effect of Temperature on Single-Particle Latchup", IEEE Transactions on Nuclear Science, vol. 38, No. 6, Dec. 1991.*
D. Uffmann, J. Ackermann, J. Stemmer, J. Aderhold, and H.-U. Schroder, Simulation Standard, "Temperature Dependence of Latch-up Holding Point for Majority Carrier Guards up to 250 degrees celcius", vol. 7, No. 6, Jun. 1996, pp. 1-4.
N.A. Dodds, J.M. Hutson, J.A. Pellish, R.A. Reed, H.S. Kim, M.D. Berg, M.R. Friendlich, A.M. Phan, C.M. Seidleck, M.A. Xapsos, X. Deng, R.C. Baumann, R.D. Schrimpf, M.P.King, L.W. Massengill, and R.A. Weller, "Selection of Well Contact Densities for Latchup-Immune Minimal-Area ICs", IEEE Transactions on Nuclear Science, vol. 57, No. 6, Dec. 2010, pp. 3575-3581.
Eilhard Haseloff, "Latch-up, ESD, and other Phenomena", Texas Instruments, Application Report SLY014A-May 2000, pp. 1-26.).

* cited by examiner

*Primary Examiner* — Jared Fureman
*Assistant Examiner* — Kevin J Comber
(74) *Attorney, Agent, or Firm* — Eugen C. Conser; Frederick J. Telecky, Jr.

(57) ABSTRACT

Integrated circuits as well as fabrication and operating methods are presented in which user circuitry of the IC is selectively disabled in response to detection of a single event latchup condition in a sensing circuit that is prone to latchup in response to ionic radiation at a specific linear energy transfer level.

20 Claims, 7 Drawing Sheets

INTEGRATED CIRCUIT WITH AUTOMATIC DEACTIVATION UPON EXCEEDING A SPECIFIC ION LINEAR ENERGY TRANSFER (LET) VALUE

FIELD OF THE INVENTION

The present disclosure relates to the field of integrated circuits, and more particularly to integrated circuits with automatic deactivation for ion linear energy transfer (LET).

BACKGROUND OF THE INVENTION

Continuing performance improvements and scaling of semiconductor devices has generally resulted in operational capabilities in excess of minimum requirements for extraterrestrial applications such as satellites in which higher levels of radiation are experienced. However, devices capable of operating in high radiation environments may be subject to usage regulations established for satellite operation, such as International Traffic in Arms Regulations (ITAR), despite being designed for other uses. Such radiation hardened (rad-hard) products are typically regulated if they satisfy all performance criteria set forth in the ITAR regulations. One ITAR criteria relates to maximum ion linear energy transfer (LET), and requires regulation of devices that are free of single event latchup with a dose rate latchup of $5 \times 10^8$ Rads (Si)/second or greater. Commercializing potentially rad-hard devices in certain countries may involve obtaining export licenses or costly product testing and sorting to verify unsuitability for satellite operation and such costs may inhibit the ability to export such products. Accordingly, improved integrated circuit designs and methods are desirable to ensure that ordinary products designed for non-satellite usage do not qualify for export restrictions per ITAR regulations.

SUMMARY OF THE INVENTION

Various aspects of the present disclosure are now summarized for compliance with 37 CFR §1.73 to facilitate a basic understanding of the disclosure by briefly indicating the nature and substance of the disclosure, wherein this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter, and this summary is submitted with the understanding that it will not be used to interpret or limit the scope or meaning of the claims. The disclosed embodiments involve integrated circuits as well as methods for operating and fabricating such, in which single event latchup (SEL) conditions are detected in a sensing circuit and user circuitry is selectively disabled in response to SEL detection.

Integrated circuits are disclosed which include one or more sensing circuits that are sensitive to single event latchup due to ionic radiation at a predetermined linear energy transfer level. An exposure detection circuit in the IC provides an output signal to a deactivation circuit in response to detection of a single event latchup condition in the sensing circuit, and the deactivation circuit selectively disables operation of a user circuit in the IC in response to the output signal from the exposure detection circuit.

In certain embodiments, the sensing circuit is rendered more sensitive to linear energy transfer through one or more techniques, such as increased circuit tap spacing in the sensing circuit compared to that of the user circuitry, increased sensing circuit well or substrate resistance, operation of the sensing circuit at a higher supply voltage, and/or the use of one or more heating components to provide heat to all or a portion of the sensing circuit during IC operation. In certain embodiments, the sensing circuit may include a memory such as an SRAM array, with the exposure detection circuit sensing increases in sensing circuit supply current and/or performing write/read tests of the sensing memory circuit in order to detect single event latchup conditions.

Further aspects of the present disclosure provide methods for operating an integrated circuit, including detecting a single event latchup condition in a sensing circuit of the IC, and automatically disabling user circuit operation in response to detection of the single event latchup condition. In certain embodiments, a supply voltage is provided to the sensing circuit that is higher than a voltage supplied to a corresponding circuit in the user circuitry.

Other aspects of the disclosure relate to methods for forming an integrated circuit, including forming at least one user circuit and at least one sensing circuit in at least one substrate, where the sensing circuit is sensitive to single event latchup in response to exposure to ionic radiation at a predetermined linear energy transfer level. The method further includes forming an exposure detection circuit in the substrate which operates to sense a single event latchup condition in the sensing circuit and provides an output signal in response to single event latchup detection. A deactivation circuit is formed on the at least one substrate which operates to selectively disable operation of the user circuit in response to the output signal from the exposure detection circuit. In certain embodiments, taps are formed in the user circuit and in the sensing circuit, with the tap density of the user circuit being greater than that of the sensing circuit. In certain embodiments, moreover, portions of the substrate are doped to establish a well or substrate resistance in the sensing circuit and the user circuit, where the well/substrate resistance of the sensing circuit is greater than that of the user circuit. In some embodiments, moreover, at least one heating component is formed in the substrate to provide heat to all or a portion of the sensing circuit during operation of the IC.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
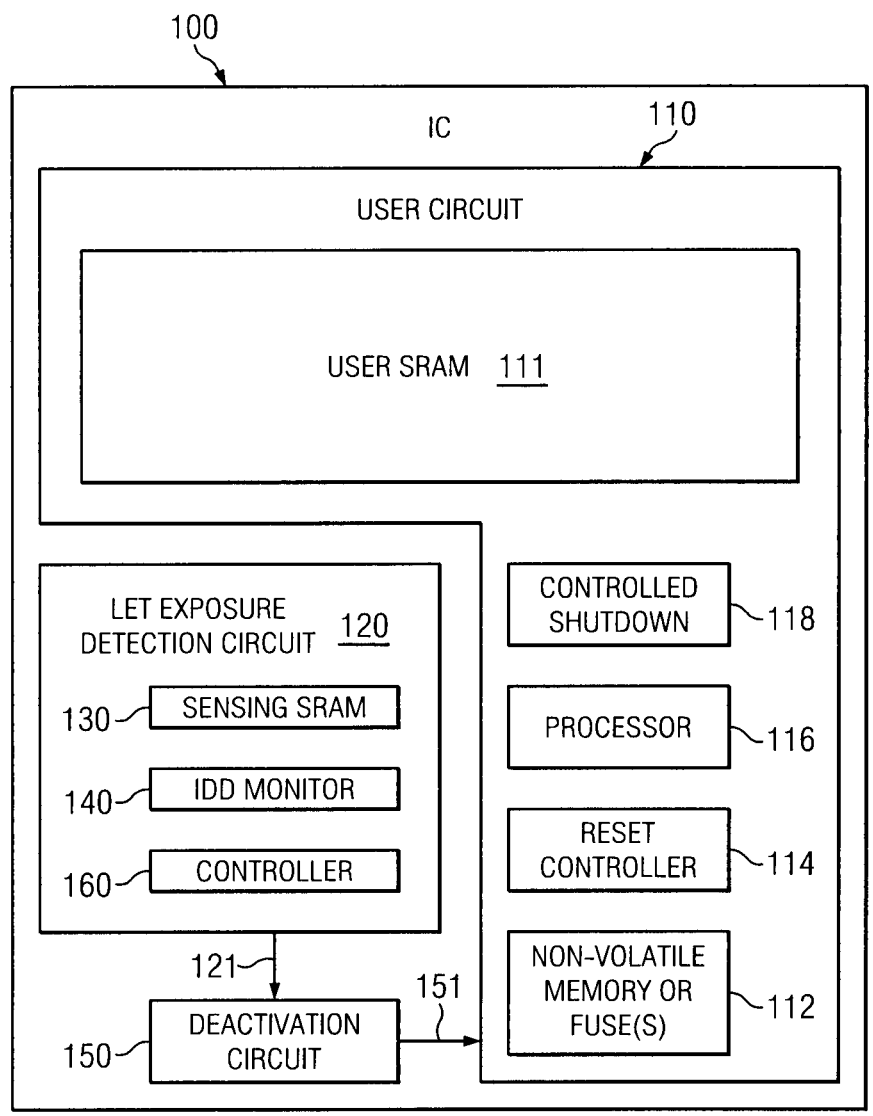
FIG. 1 is a simplified top plan view of an integrated circuit with linear energy transfer exposure detection circuit including a sensing SRAM circuit, a sensing circuit current monitor and a controller providing a signal to a deactivation circuit for selective shutdown of user circuitry in accordance with one or more aspects of the disclosure.
Figure 2:
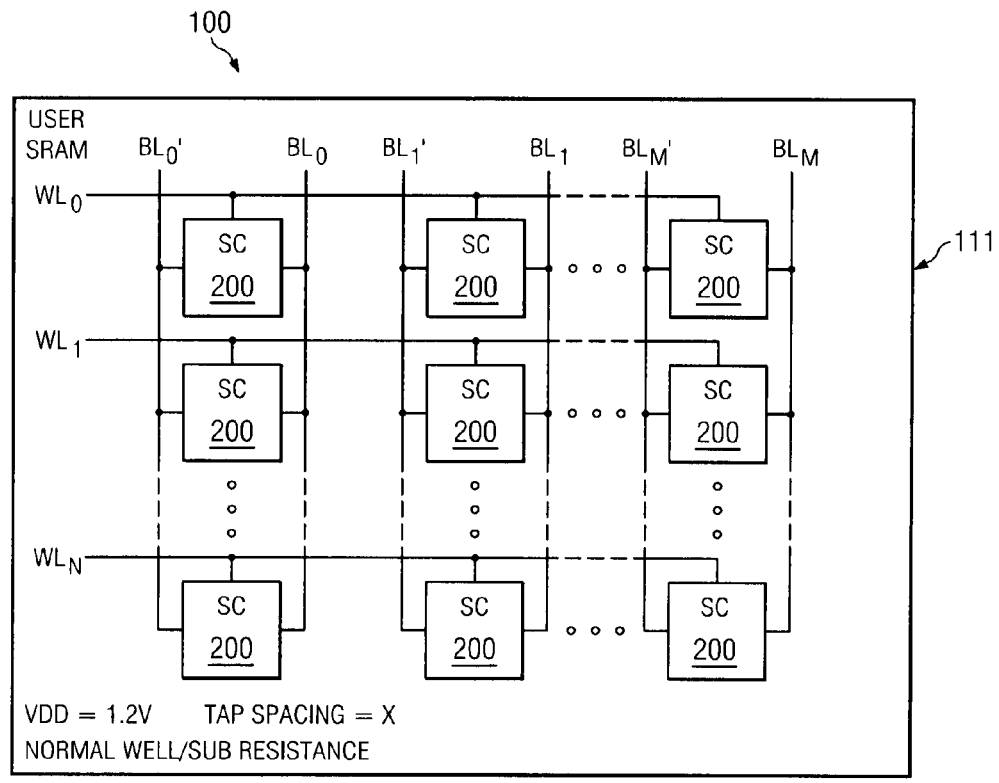
FIG. 2 is a partial schematic view of a user SRAM and a sensing SRAM in the integrated circuit of FIG. 1.
Figure 2:
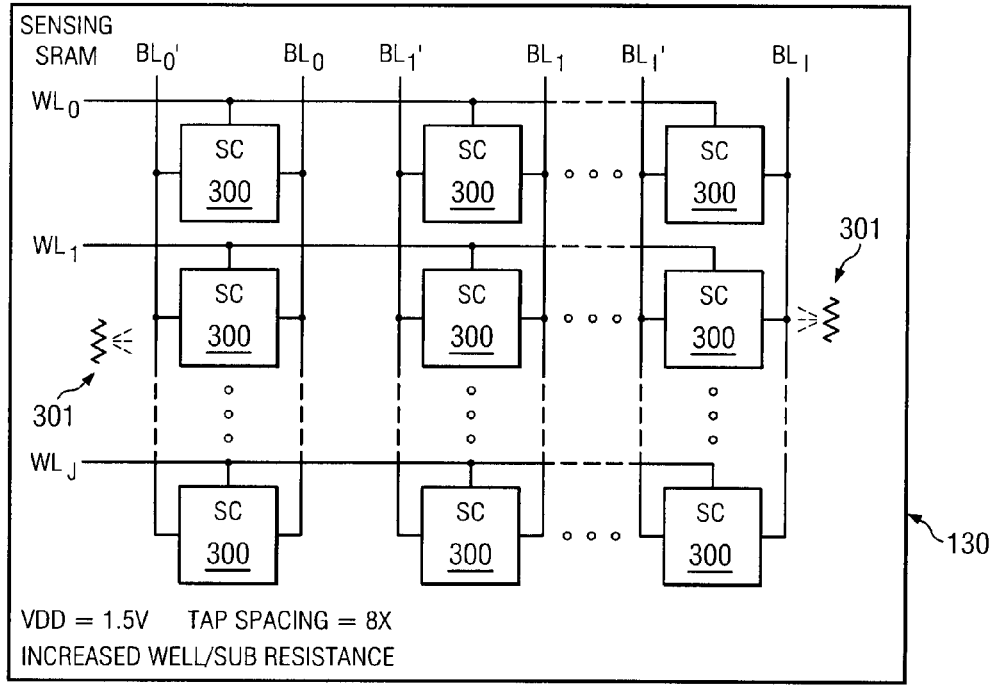

One or more embodiments or implementations are hereinafter described in conjunction with the drawings, in which like reference numerals are used to refer to like elements throughout, and the various features are not necessarily drawn to scale.

FIG. 1 illustrates an exemplary integrated circuit (IC) 100 including user circuitry 110, a linear energy transfer (LET) exposure detection circuit 120 and a deactivation circuit 150. The IC 100 can be any form of integrated circuit that includes one or more types of user circuits 110 including without limitation power circuits, digital circuitry, analog circuitry, electronic memory, digital signal processing (DSP) circuitry, programmable logic, or combinations thereof. The user circuit 110 in FIG. 1 includes non-volatile memory (e.g., ferroelectric random access memory or FRAM), fuses and/or antifuses 112 as well as a processor 116 with a reset controller 114 and controlled shutdown programming or logic 118. In addition, the illustrated embodiment includes a user SRAM 111 providing memory for storing program and/or data.

The LET exposure detection circuit 120 includes a sensing circuit 130, such as a sensing SRAM in certain embodiments. In other embodiments, the sensing SRAM 130 may be part of the user SRAM 111, with the access to the sensing SRAM 130 being restricted such that a user cannot access the sensing SRAM memory space. Although illustrated and described below as using a SRAM sensing circuit 130, any other suitable form of sensing circuit 130 may be used which is subject to single event latchup conditions in response to exposure to ionic radiation of the integrated circuit 100 at a predetermined linear energy transfer level, including without limitation other types of memory circuits, logic circuits, etc. In addition, the LET exposure detection circuitry 120 includes one or more circuits operable to detect a single event latchup (SEL) condition in the sensing circuit 130 and provides an output signal 121 to a deactivation circuit 150. The deactivation circuit 150, in turn, provides one or more output signals 151 to the user circuit 110 in order to selectively disable or deactivate the user circuit 110. In certain embodiments, the exposure detection circuit 120 includes a current monitor circuit 140 operative to sense a supply current provided to the sensing circuit 130 (e.g., IDDs) and/or may include a controller 164 performing a write/read test of a sensing SRAM 130 to identify single event latchup conditions. Moreover, the IC 100 may be formed using a single substrate or multiple chips and associated substrates could be used in constructing the integrated circuit 100. For instance, the user circuit or circuits 110 may be formed in a first substrate and the sensing circuit(s) can be constructed in a different substrate with multiple chips being interconnected in fabrication of the finished IC 100.

Referring also to FIGS. 2-5, FIG. 2 schematically illustrates memory arrays in the user SRAM 111 and in the sensing SRAM 130, in which the user SRAM 111 provides an array of SRAM cells (SC) 200 providing read and write capabilities for user data using wordlines $WL_0$-$WL_N$ and complementary bitlines $BL_0/BL_0'$-$BL_M/BL_M'$ to form a N×M user memory array. In the illustrated example, moreover, the user SRAM 111 is operated at a first supply voltage level (e.g., VDD=1.2 V) and is constructed with a first tap spacing "X" using well and substrate doping to provide a baseline or normal well resistance and/or substrate resistance in the SRAM cells 200. The phrase "tap spacing" as used herein includes without limitation well-contact spacing or substrate-contact spacing. The sensing SRAM 130 includes an I×J array of SRAM cells 300 configured along an integer number "J" wordline rows $WL_0$-$WL_J$ and an integer number "1" bitline columns $BL_0/BL_0'$-$BL_1/BL_1'$. In practice, the sensing SRAM 130 may be small relative to the user SRAM 111, although not a strict requirement of the present disclosure.

Figure 4:
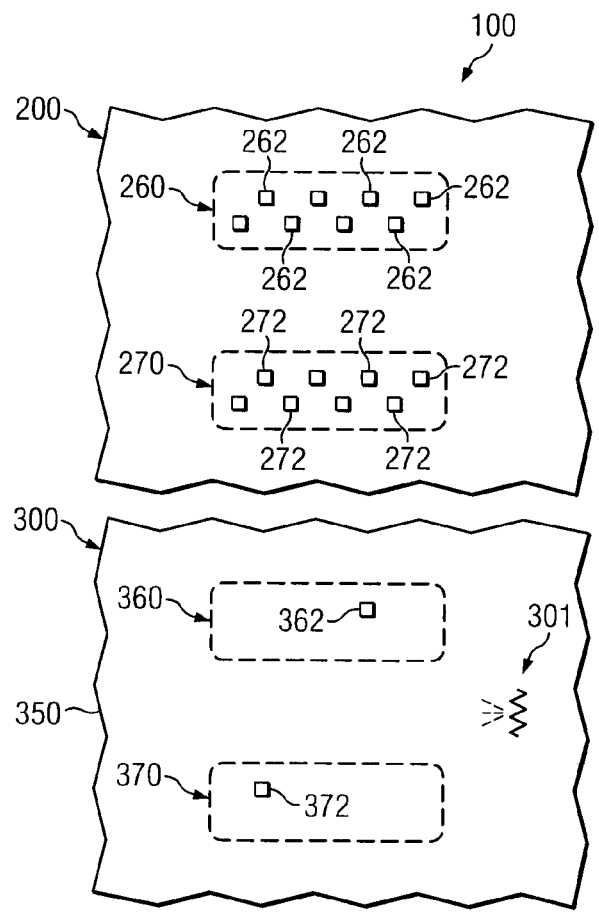
FIG. 4 is a partial top plan view illustrating wells formed in the user and sensing SRAM portions of the integrated circuit, showing reduced tap density and increased tap spacing as well as incorporation of heating components in the sensing SRAM.

The sensing SRAM circuit 130 may be rendered more susceptible or sensitive than the user circuitry 110 to single event latchup caused by ionic radiation of the IC 100 by one or more techniques. In certain embodiments, for example, the sensing SRAM includes one or more heating elements 301 which are powered during operation of the IC 100 and are positioned so as to provide heat to one or more of the sensing RAM cells 300 or portions thereof. The inventor has appreciated that single event latchup susceptibility increases with temperature, whereby the selective provision of one or more heating elements 301 renders the sensing SRAM 130 sensitive to single event latchups. The sensing circuit 130, moreover, may be provided with a higher operating voltage (e.g., VDD=1.5 V) than the supply voltage of the corresponding or comparable user SRAM circuitry 111 (e.g., VDD=1.2 V). The same is true of other forms of sensing circuit 130, for instance, wherein a sensing logic circuit 130 may be provided with a higher supply voltage then a similar or identical user logic circuit 110. As a result, the sensing circuit 130, whether SRAM or other type, is more apt to suffer a single event latchup condition than the corresponding or comparable user circuit 110. Also, the sensing circuit 130 can be constructed in certain embodiments using higher tap spacing (lower tap density) than the comparable user circuitry 110, and/or the well or substrate resistance of the sensing circuit 130 can be made greater than corresponding well or substrate resistance(s) of the user circuit 110, as best seen in FIGS. 4 and 5. In this manner, the sensing circuitry 130 is more sensitive to LET than the user circuitry 110 in certain embodiments.

Figure 3:
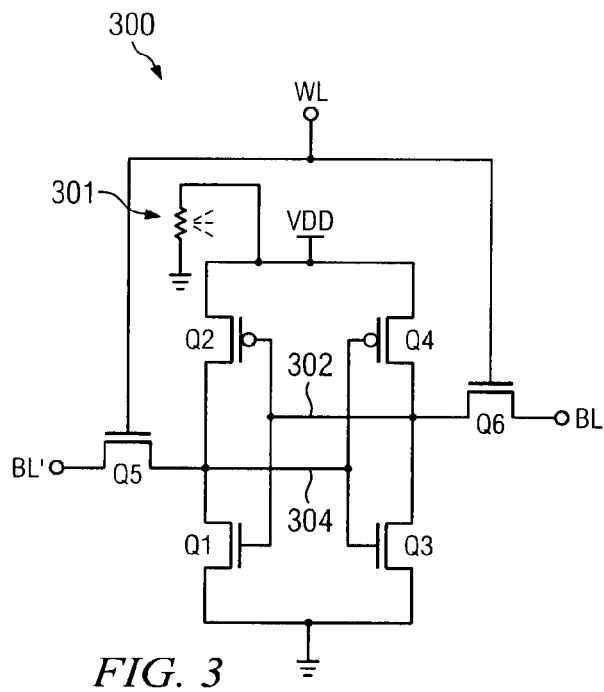
FIG. 3 is a schematic diagram illustrating an exemplary 6 transistor SRAM cell in the sensing SRAM of the integrated circuit.

FIG. 3 shows an exemplary 6-transistor (6T) SRAM cell 300 in the sensing SRAM 130, which employs transistors Q1-Q6 to store and provide access to a single binary bit of data. Transistors Q1-Q4 form a pair of cross-coupled CMOS inverters, each having one of the bitline signals BL or BL' as an input, with the NMOS transistors Q5 and Q6 providing pass gate access for selective operation according to the corresponding wordline signal WL from the SRAM access logic (not shown). A first inverter formed by transistors Q1 and Q2 has an input terminal 302 and an output 304, where the input 302 receives the input from bitline BL via Q6 when the corresponding wordline WL is active (high) during write operations. The output 304 of the first inverter Q1/Q2 is an input to the second inverter formed by Q3 and Q4 and is selectively coupleable to the complementary bit line BL' through Q5, with the inverter Q3/Q4 providing an output at node 302.

Figure 5:
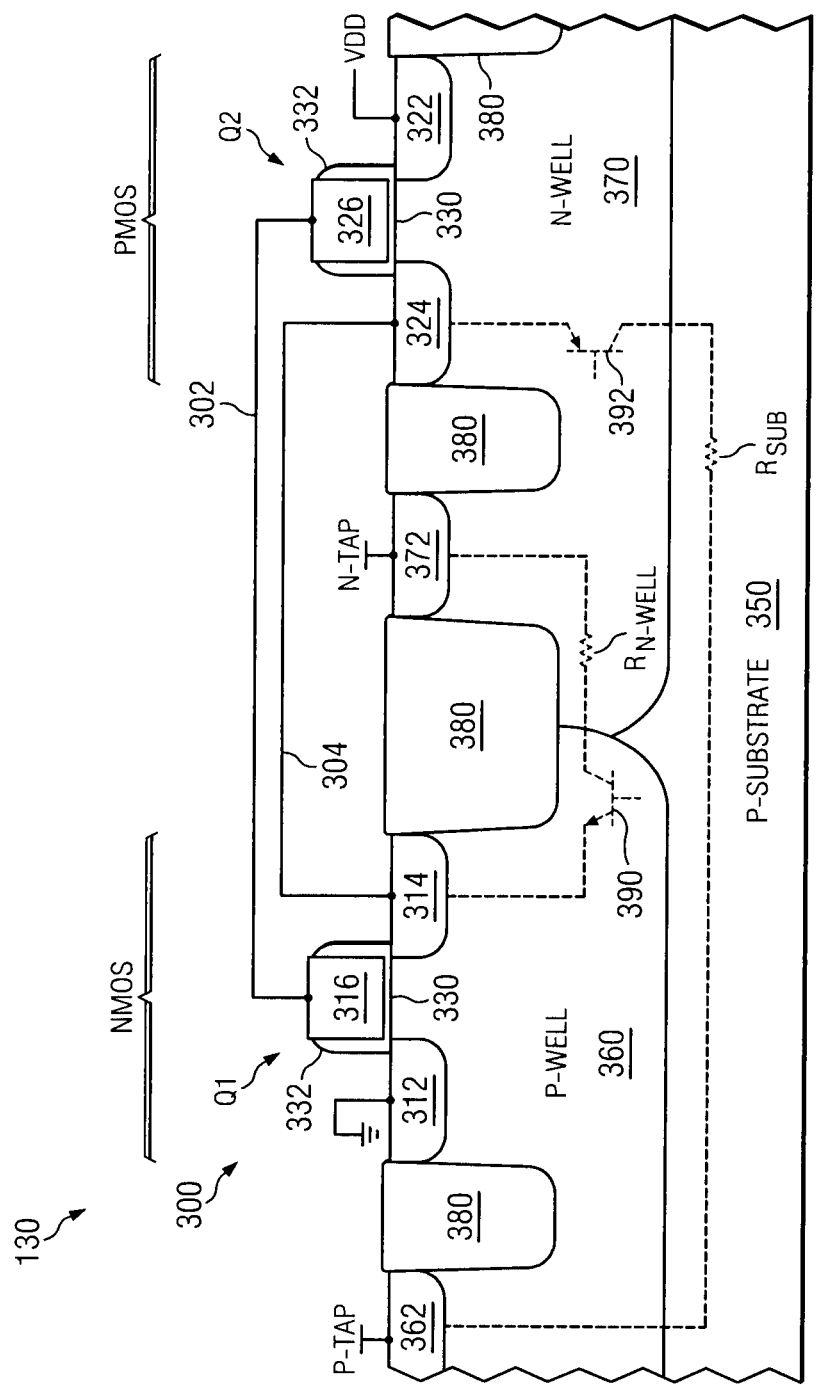
FIG. 5 is a partial sectional side elevation view of a portion of a CMOS sensing SRAM cell illustrating P-well and N-well taps as well as parasitic NPN and PNP bipolar transistors in the integrated circuit.

FIG. 5 illustrates a first inverter portion Q1/Q2 of the exemplary CMOS 6-T SRAM cell 300 in the sensing SRAM 130. The illustrated portion includes an NMOS device Q1 and a PMOS device Q2 which form part of the larger cell 300 in the integrated circuit 100, where the illustrated cell 300 and the overall sensing SRAM 130 are constructed to be particularly susceptible to single event latchup. The NMOS and PMOS devices Q1 and Q2 are formed in a P type substrate 350 and include gate electrodes 316 and 326 formed on a gate insulator layer 330 above a channel region. The gate electrodes 316 and 326 each include protective sidewall spacer insulators 332, and the transistors Q1 and Q2 further include source electrodes 312 and 322 as well as drain electrodes 314 and 324, respectively. The source and drain 312 and 314 of the NMOS transistor Q1 are n-doped, whereas the PMOS source and drain 322 and 324 are p-doped regions within the N-well 370.

In this example, the NMOS device Q1 is formed in a P-well 360 in the substrate 350 and the PMOS transistor Q2 is formed in an N-well 370, although other embodiments are possible, for instance with the NMOS device Q1 formed in the P-substrate 350 without provision of a P-well 360. Field oxide isolation structures 380 are formed at the outer perimeters of the transistors Q1 and Q2 as well as between the transistors Q1/Q2 and tap structures 362 and 372 through LOCOS, shallow trench isolation (STI), or other suitable techniques. The P-well 360 is doped to isolate the NMOS device Q1 from other PMOS devices (e.g., Q2), while the N-well 370 doping is provided to isolate the PMOS device Q2 from other NMOS devices. Channel doping regions (not shown) may be provided by halo or pocket implants. In this case, the SRAM inverter formed by transistors Q1 and Q2 has the source 312 of Q1 grounded and the source of the PMOS device Q2 connected to the supply voltage VDD, with the drains 314 and 324 being coupled together at node 304, and with the gate electrodes 316 and 326 coupled together at the internal mode 302. In the illustrated portion of FIG. 5, a P type tap 362 provides a conductive contact to the P-well 360 and an N type tap 372 provides a conductive contact to the N-well 370.

As further seen in FIG. 5, moreover, the CMOS structure creates parasitic bipolar NPN transistor 390 and PNP transistor 392, with an N-well resistance $R_{N\text{-}WELL}$ of the N-well 370 contributing to the gain of the NPN transistor 390, and a substrate resistance $R_{SUB}$ contributing to the gain of the PNP transistor 392. Latchup can adversely affect CMOS circuits such as the sensing SRAM cells 300 through unintended operation of the lateral bipolar NPN and PNP transistors 390 and 392. These unwanted parasitic bipolar transistors can act as amplifiers, causing conduction from power to ground. To try to minimize these situations, conventional CMOS layout techniques utilize N-type and P-type well implants for the PMOS and NMOS devices respectively, with the N-type and P-type well implants being electrically connected via ohmic contacts or taps to VDD and ground power supplies respectively.

As seen in FIGS. 4 and 5, certain embodiments of the sensing SRAM 130 and the cells 300 thereof employ different well/substrate doping and tap spacing (tap density) than are used in the corresponding user SRAM 111, in order to render the sensing circuit 130 more susceptible to single event latchup. These concepts can be implemented where a single substrate is used for forming both the user SRAM 111 in the sensing SRAM 130, and/or can be employed where the user and sensing circuitry are formed in different substrates. FIG. 4 illustrates the P-well 360 and N-well 370 of the sensing SRAM cell 300, and also illustrates a portion of a comparable SRAM cell 200 in the user SRAM 111 having a P-well 260 as well as an N-well 270. In the user SRAM cell 200, taps 272 are formed in the N-well 270 and taps 262 are formed in the P-well 260, with approximately 8 taps being provided in each of the wells 260, 270. The sensing SRAM cell 300, in contrast, provides greatly reduced tap density and increased tap spacing, with only a single tap 362 in the P-well 360 and a single tap 372 in the N-well 370. In this regard, the inventor has appreciated that decreasing the tap density (and thus increasing the spacing of the taps) tends to make the SRAM cell 300 more sensitive to single event latchup when exposed to ionic radiation at a predetermined linear energy transfer level. Thus, the present disclosure contemplates selective use of lower tap density (higher tap spacing) in the sensing circuit 130 compared with that of a corresponding or comparable circuit in the user circuitry 110. In certain embodiments, the tap density of the user SRAM 111 is at least twice the tap density of the sensing circuit 130. In further embodiments, the user SRAM tap density as at least eight times the sensing SRAM tap density.

In addition, as seen in FIGS. 3 and 4, certain embodiments of the sensing circuit 130 include one or more heating elements 301, such as depicted in FIG. 3 as a resistance 301 coupled between the supply voltage VDD and ground. Such a resistor or resisters 301 can be constructed in sensing circuit 130 of the IC using any suitable resistor fabrication techniques. In one possible embodiment, the resistance is created within or near the sensing SRAM 130 and provided with a supply voltage during operation of the IC 100 to conduct current through the resistance element 301. The metallization of the IC 100 and interconnection of various components is preferably done to avoid or mitigate thermal transfer between the sensing SRAM 130 and the user circuitry 110 such that the heating provided by the components 301 is generally localized to the sensing circuit 130. In this regard, the inventor has further appreciated that sensitivity to ionic radiation induced single event latchup occurrences increases with operating temperature, whereby the provision of one or more heating components 301 in or near the sensing circuit 130 advantageously makes the sensing circuitry 130 more sensitive and thus more likely to experience a single event latchup condition than is the user circuitry 110.

In certain embodiments, moreover, fabrication process modifications may be used to increase the substrate and/or well resistances, such as the resistance $R_{N\text{-}WELL}$ of the N-well 370 contributing to the gain of the NPN transistor 390, and/or the substrate resistance $R_{SUB}$ contributing to the gain of the PNP transistor 392 as seen in FIG. 5. Such modifications in construction of the sensing circuit 130 can be done to provide a well or substrate resistance in the sensing circuit 130 that is greater than that of a corresponding or comparable user circuit 110 (e.g., where the well and/or substrate resistances $R_{N\text{-}WELL}$, $R_{SUB}$ in the sensing SRAM 130 are greater than the well and/or substrate resistances of the user SRAM circuit 111). In this manner, the sensing SRAM 130 is more likely to experience a single event latchup before the user SRAM 111 does. In certain embodiments, for instance, the n-type implantation dosage of the N-well 370 can be selectively decreased in order to increase the sensitivity to latchup by increasing the operational gain of the NPN parasitic bipolar transistor 390. In addition or separately, some n-type dopants can be added for compensation into the P-substrate 350 within the sensing circuit 130 to increase the substrate resistance $R_{SUB}$, thereby increasing the gain of the bipolar transistor 392. In this regard, such modifications to render the sensing circuit 130 more susceptible to single event latchup may be advantageously accomplished without addition of further fabrication processing steps, for example, by modifying implant masks used elsewhere in the process in order to perform such doping adjustments, particularly for single-substrate implementations.

Referring also to FIGS. 6-12, the integrated circuit 100 also includes an exposure detection circuit 120 which senses single event latchup conditions in the sensing circuit 130 and provides an output signal 121 to the deactivation circuit 150 for controlled deactivation of the user circuitry 110 in the integrated circuit 100. The exposure detection circuit 120 can be any suitable circuitry operatively coupled with the sensing circuit 130 in order to sense or detect single event latchup conditions. In the illustrated embodiments having sensing SRAM circuitry 130, various different exposure detection circuits 120 can be used, for example, to detect increases in current consumed by the sensing circuit 130 and/or to detect failure or changes in bit error rate by write/read testing of the sensing SRAM 130.

Figure 6:
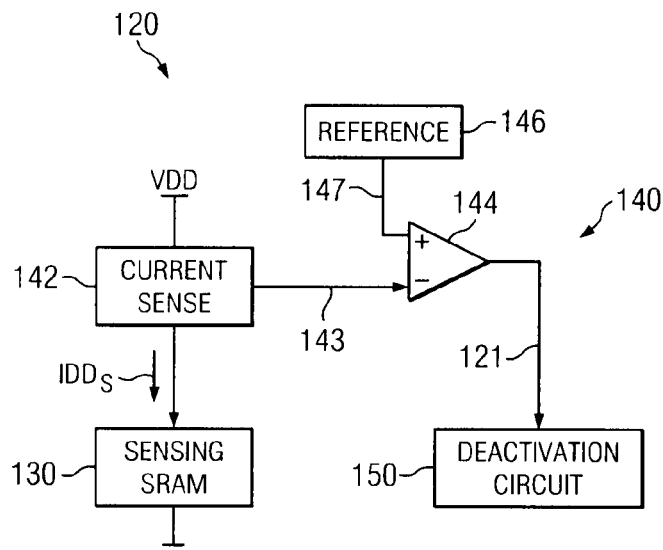
FIG. 6 is a schematic diagram illustrating an exemplary current monitoring circuit with a current sensing component and a comparator providing an output signal to a deactivation circuit in response to a sensing SRAM supply current exceeding a predetermined threshold.
Figure 7:
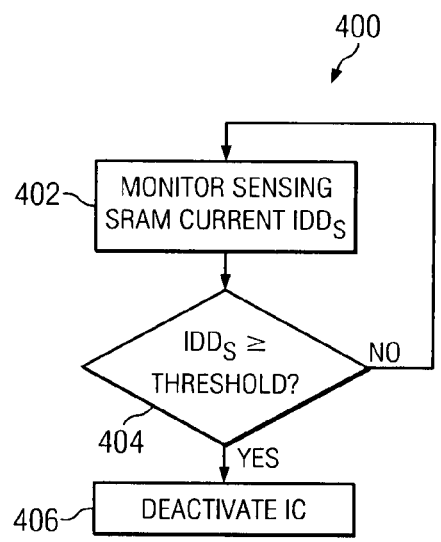
FIG. 7 is a flow diagram illustrating an exemplary method for selectively deactivating the user portion of the integrated circuit based on a sensing SRAM supply current threshold comparison.

FIGS. 6 and 7 illustrate one embodiment, in which the sensing SRAM supply current $IDD_S$ is compared with the output of a reference 146 to detect increases in the sensing SRAM current flow. In this regard, the inventor has appreciated that current injection into the IC 100 from ionic radiation of a given level can cause one or more parasitic bipolar transistors (e.g., transistors 390, 392 in FIG. 5 above) to turn on, depending on well size, the spacing between anode and cathode, the width of the base region, the values of the well and substrate resistances $R_{N\text{-}WELL}$ and $R_{SUB}$, etc. Once one of these bipolar transistors 390, 392 is turned on, the current $IDD_S$ supplied to the sensing SRAM 130 will increase significantly. Accordingly, the exposure detection circuit 120 in FIG. 6 includes a current monitor circuit 140 with a current sensor 142 that provides a sensor signal 143 representing the value of the sensing SRAM supply current $IDD_S$. A comparator 144 compares the sensor signal 143 with an output 147 of the reference 146, and the comparator output selectively provides the output signal 121 in response to the sensor signal 143 being greater than or equal to the reference signal 147. Any suitable reference 146 may be employed which provides a reference signal 147 for comparison with the sensed sensing SRAM current $IDD_S$ in order to detect the occurrence of a single event latchup in response to ionic radiation received by the integrated circuit 100. This operation is illustrated in the process 400 of FIG. 7, in which the sensing SRAM current $IDD_S$ is monitored at 402 and a determination is made at 404 as to whether the monitored current $IDD_S$ is greater than or equal to a predetermined threshold. If not (NO at 404), the process continues to monitor the sensing SRAM current $IDD_S$ at 402. Once the sensing SRAM current $IDD_S$ meets or exceeds the threshold (YES at 404), the IC is deactivated at 406.

In the example of FIG. 6, the deactivation circuit 150 receives the signal 121 from the exposure detection circuit 120 and provides one or more output signals 151 to the user circuit 110 in order to selectively disable or deactivate the user circuit 110. In certain embodiments, the disabling or deactivation of the user circuitry 110 is done by the deactivation circuit 150 selectively blowing a fuse and/or an anti-fuse and/or by setting one or more bits of a nonvolatile memory 112 in the user circuit 110 which thereafter renders the user circuitry 110 inoperable even if the input power is cycled to the integrated circuit 100. For instance, as seen in FIG. 1, the integrated circuit 100 may include one or more processor elements 116 with an associated reset controller circuit 114 which performs reset and startup operations contingent upon reading a predetermined logic state of a nonvolatile memory a bit or of a voltage of a circuit that includes a fuse or anti-fuse. In this example, the deactivation circuit 150 selectively changes the state of the nonvolatile memory bit or blows a fuse or anti-fuse in the circuit 112 by way of a deactivation signal 151 in response to receipt of a comparator output signal 121 indicating that the sensing SRAM current $IDD_S$ meets or exceeds the predetermined reference value or threshold 146. In this manner, the user circuitry 110 will thereafter be disabled or deactivated, even if power is discontinued and thereafter reapplied.

In other possible embodiments, the deactivation circuit 150 provides an interrupt to the processor 116 which causes the processor to implement a controlled shutdown program or routine 118, for example allowing a certain small number of processor cycles (e.g., 1,000) in which the user circuitry 110 can be safely deactivated in response to receipt of the exposure detection signal. In this case, the controlled shutdown routine 118 may include changing a bit in the nonvolatile memory or blowing a fuse or antifuse 112 such that the user circuitry 110 is thereafter deactivated. In other possible implementations, the signal 151 from the deactivation circuitry 150 may change the nonvolatile memory bit and/or blow the necessary fuse or anti-fuse such that the user circuit 110 is thereafter disabled, in addition to providing an interrupt to cause the user circuit 110 to initiate a controlled shutdown program or routine 118.

Figure 8:
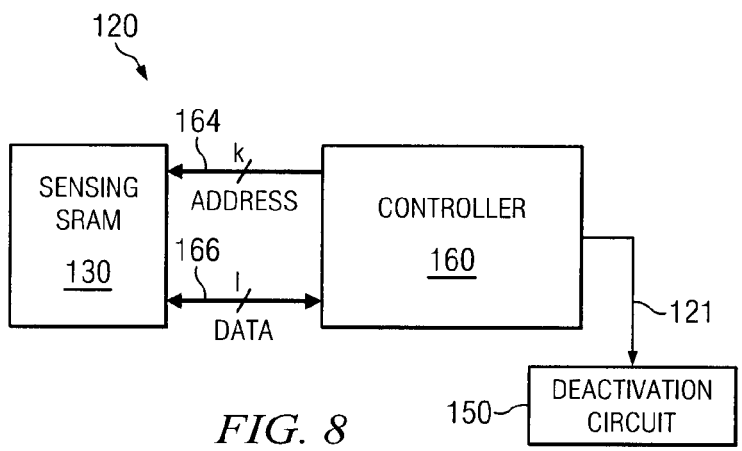
FIG. 8 is a schematic diagram illustrating an exemplary controller for performing a write/read test of the sensing SRAM and providing an output signal to a deactivation circuit in the integrated circuit.
Figure 9:
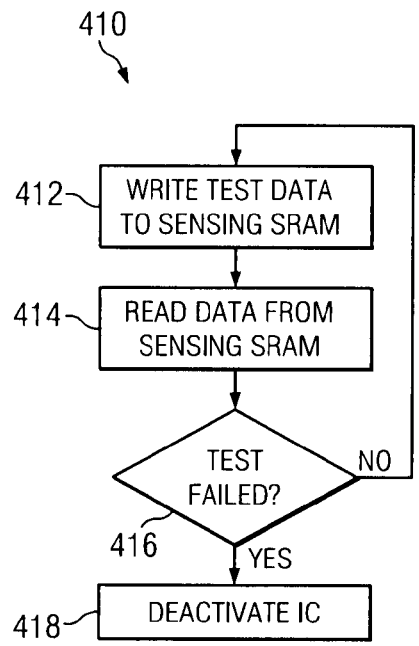
FIG. 9 is a flow diagram illustrating an exemplary method for selectively deactivating the integrated circuit based on failure of a write/read test.

FIGS. 8 and 9 illustrate another embodiment in which a controller 160 is operatively coupled with the sensing SRAM 130 to perform various reading and writing operations via an address bus 164 having an integer number "k" address lines and a data bus 166 with "l" data lines. The controller 160 can be any suitable control circuitry, which may be programmable logic, analog and/or digital circuits capable of providing control signals and applying supply voltages in order to write data to the sensing SRAM 130 and to read data therefrom. In addition, the controller 160 in certain embodiments is operative to compare data read from the sensing SRAM 130 with comparison data, for instance in order to determine if data previously written to the sensing SRAM 130 in a write/read test was correctly read back from the sensing SRAM 130. Moreover, certain embodiments of the controller 160 are configured to perform multiple write/read tests and to obtain and evaluate bit error rate data, including comparing bit error rates to threshold values in order to detect increases in the bit error rate based on the write/read testing of the sensing SRAM 130.

FIG. 9 illustrates a process 410 for selective deactivation of the integrated circuit 100 based on detected single event latchup conditions in the sensing memory 130 using the controller 160 of FIG. 8. At 412, the controller 160 performs one or more write operations in order to write test data to the sensing SRAM 130. At 414, the controller 160 reads data from the sensing SRAM 130, and a determination is made at 416 as to whether the write/read test failed. If not (NO at 416), the process 410 returns to 412, 414 for further write/read testing. If the test fails (YES at 416), the controller 160 provides the output signal 121 to the deactivation circuit 150 (FIG. 8) in order to deactivate the integrated circuit 100 at 418. In certain embodiments, the controller 160 monitors and/or computes a bit failure count and/or a bit error rate, and the write/read testing can involve multiple write/read cycles. In other embodiments, multiple read operations can follow a given write operation until a bit error is detected in the read operation, followed by another write operation. In practice, the controller 160 may be configured to detect a discontinuity (rapid increase) in a monitored bit error rate (bit errors per unit time), and may compare a monitored bit error rate to a threshold value. In such embodiments, for example, the controller 160 can provide the exposure detection circuit output signal 121 to the deactivation circuit 150 based on the monitored bit error rate meeting or exceeding such a threshold value. In other possible embodiments, the controller 160 may perform periodic or repeated write/read tests, and computes a bit failure count for each such test, or for groups of such tests, and compare the bit failure count to a threshold, with the detection circuit output signal 121 being selectively generated based on this threshold comparison.

Figure 10:
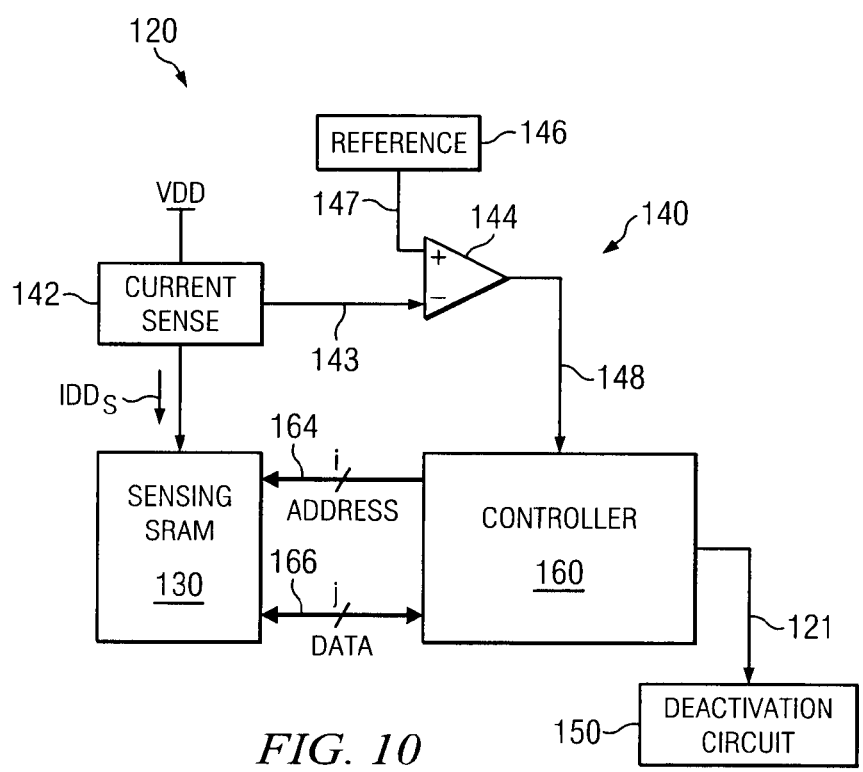
FIG. 10 is a schematic diagram illustrating an exemplary linear energy transfer exposure detection circuit providing an output signal to a deactivation circuit of the IC based on sensing SRAM current level and failure of a write/read test in the integrated circuit.
Figure 11:
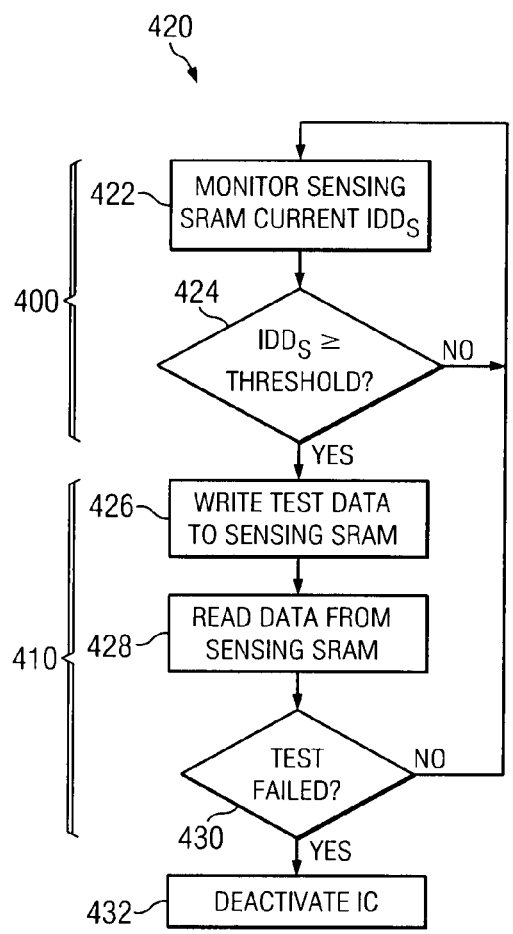
FIG. 11 is a flow diagram illustrating another exemplary method for selectively deactivating the integrated circuit based on sensing circuit current level and failure of a write/read test.

FIGS. 10 and 11 illustrate further embodiments in which the sensing SRAM supply current $IDD_S$ is monitored via current monitoring circuitry 140 and write/read testing of the sensing SRAM 130 is performed via the controller 160 with selective provision of the exposure detection circuit output signal 121 to the deactivation circuit 150 based on this current monitoring and write/read testing. In this example, a current sensor 142 provides a sensor signal 143 indicating the amount of supply current $IDD_S$ provided to the sensing SRAM 130, and the sensor signal 143 is compared to the output signal 147 of the reference 146 using the comparator 144, as discussed above in connection with FIG. 6. In this embodiment, the comparator output signal 148 is provided to the controller 160, which performs a write/read test of the sensing SRAM 130 in response to receipt of the signal 148 from the comparator 144.

FIG. 11 illustrates a process 420 including current monitoring 400 and write/read testing 410 generally as described above in connection with FIGS. 7 and 9. At 422 in FIG. 11, the sensing SRAM supply current $IDD_S$ is monitored, and a determination is made at 424 as to whether the SRAM current $IDD_S$ meets or exceeds a predetermined threshold (e.g., the output 147 of the reference 146 in FIG. 10). If not (NO at 424), the supply current monitoring continues at 422. Once the supply current meets or exceeds the threshold (YES at 424), the controller 160 writes test data to the sensing SRAM 130 at 426 and reads data from the sensing SRAM at 428. The controller 160 then makes a determination at 430 as to whether the write/read test failed, and if not (NO at 430), the process 420 returns to again monitor the sensing SRAM supply current $IDD_S$ at 422. If the write/read test fails (YES at 430), the controller 160 provides the output signal 121 to the deactivation circuit 150 in order to deactivate the integrated circuit 100 at 432.

Figure 12:
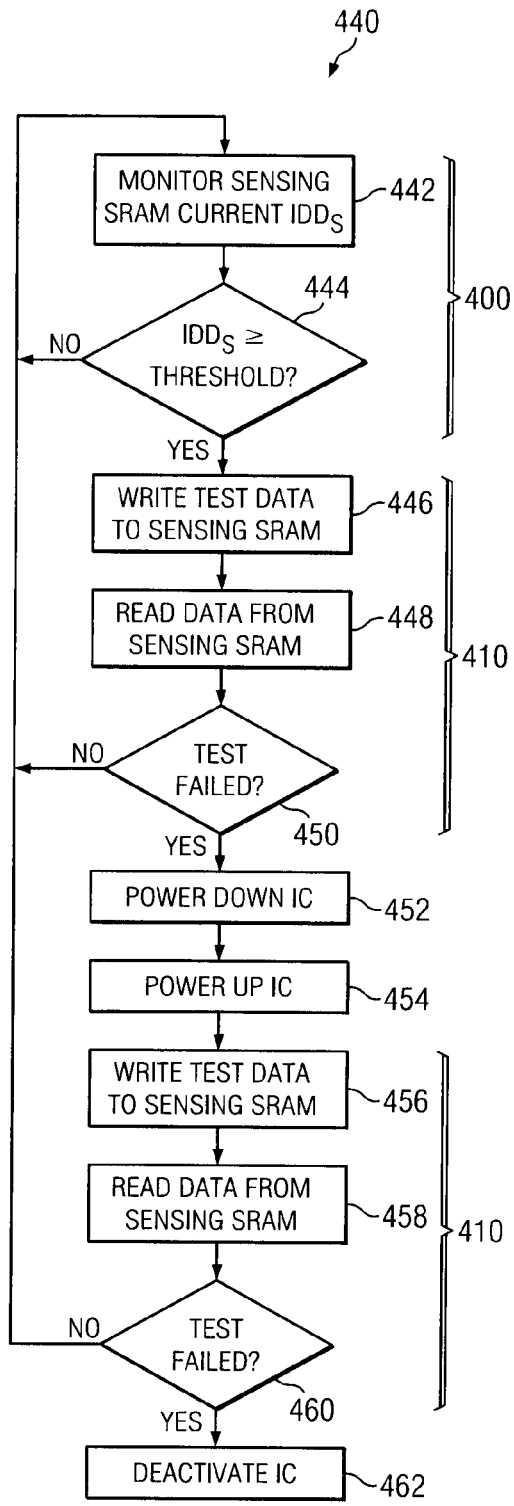
FIG. 12 is a flow diagram illustrating another exemplary method for selectively deactivating the integrated circuit.

FIG. 12 illustrates yet another process 440 for selective automatic integrated circuit deactivation based on detected single event latchup conditions. At 422, the sensing SRAM supply current $IDD_S$ is monitored and compared with a threshold at 444. If the monitored supply current $IDD_S$ remains below the threshold (NO at 444), the process 440 continues the current monitoring at 442. Once the threshold is met or exceeded (YES at 444), the controller 160 writes test data to the sensing SRAM at 446 and reads the data back from the sensing SRAM 130 at 448. A determination is made at 450 as to whether the write/read test failed, and if not (NO at 450), the process returns again to monitor the supply current at 442. If the initial write/read test at 446, 448 fails (YES at 450), the controller 160 cycles the power to the IC 100 (powered down at 452 followed by power up at 454), after which a subsequent write/read test is performed at 456-460. Test data is written to the sensing SRAM 130 at 456 and data is read from the sensing SRAM 130 at 458. A determination is made at 460 as to whether the write/read test has failed. If not (NO at 460), no SEL condition is presumed, and the process 440 returns to monitor the sensing SRAM supply current $IDD_S$ at 442. Otherwise (YES at 460), the controller 160 presumes that a single event latchup condition exists in the integrated circuit 100, and deactivates the IC 100 at 462. As noted above, the success or failure of a given one of the initial or subsequent write/read test in FIG. 12 can be based on a determination (e.g., by the controller 160) that the data read from the sensing memory 130 is different from the data previously written to the sensing memory 130. In other embodiments, the determination of whether the write/read test was successful can be based on detection of a change in a bit error rate associated with repeated write/read tests of the sensing memory 130 and/or on comparison of a bit error count with a threshold or any other suitable write/read test failure criterion.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:
1. An integrated circuit, comprising:
at least one sensing circuit sensitive only to a single event latchup SEL in response to exposure to ionic radiation of the integrated circuit at a predetermined linear energy transfer level LET, wherein the exposure detection circuit is configured for detection of specific level of ion linear energy transfer LET by adjusting the tap density of the substrate, the temperature of the exposure detection circuit, the substrate resistance, substrate doping or any combination thereof;
an exposure detection circuit operative to sense the occurrence of a single event latchup SEL condition induced by an ion of a specific and predetermined LET in the at least one sensing circuit, providing an output signal in response to detection of the single event latchup SEL condition in the at least one sensing circuit; and
a deactivation circuit receiving the output signal from the exposure detection circuit and operative to selectively disable operation of a user circuit of the integrated circuit responsive to the output signal from the exposure detection circuit.

2. The integrated circuit of claim 1, wherein the user circuit has a first tap density, wherein the at least one sensing circuit has a second tap density, and wherein the first tap density is at least twice the second tap density.

3. The integrated circuit of claim 2, wherein the first tap density is at least 8 times the second tap density.

4. The integrated circuit of claim 1, wherein a well or substrate resistance of the at least one sensing circuit is greater than a corresponding well or substrate resistance of the user circuit.

5. The integrated circuit of claim 1, wherein the at least one sensing circuit is powered by a supply voltage that is higher than a voltage supplied to a corresponding circuit in the user circuit.

6. The integrated circuit of claim 1, comprising at least one heating component operative to provide heat to at least a portion of the at least one sensing circuit during operation of the integrated circuit.

7. The integrated circuit of claim 1, wherein the at least one sensing circuit includes a sensing memory circuit.

8. The integrated circuit of claim 7, wherein the exposure detection circuit is operative to sense a supply current of the at least one sensing memory circuit, and to provide the output signal indicating detection of a single event latchup condition in response to the sensed supply current being greater than or equal to a predetermined threshold.

9. The integrated circuit of claim 8, wherein the exposure detection circuit comprises:
   a current sensor providing a sensor signal representing the supply current of the at least one sensing memory circuit;
   a reference providing a reference signal; and
   a comparator circuit comprising:
     a first input terminal connected to receive the reference signal from the reference,
     a second input terminal connected to receive the sensor signal from the current sensor, and
     an output providing the output signal responsive to the sensor signal being greater than or equal to the reference signal.

10. The integrated circuit of claim 7, wherein the exposure detection circuit comprises a controller coupled with the sensing memory circuit, the controller being operative to write test data to the sensing memory circuit, to read data from the sensing memory circuit, to compare the written test data to the data read from the sensing memory, and to selectively provide the output signal indicating detection of a single event latchup condition in the at least one sensing circuit based on the comparison of the written test data and the data read from the sensing memory.

11. The integrated circuit of claim 10, wherein the controller is operative to provide the output signal indicating detection of a single event latchup condition in the at least one sensing circuit if the data read from the sensing memory is different from the written test data.

12. The integrated circuit of claim 10, wherein the controller is operative to provide the output signal indicating detection of a single event latchup condition in the at least one sensing circuit in response to detection of a change in a bit error rate associated with repeated write/read tests of the sensing memory.

13. The integrated circuit of claim 7, wherein the exposure detection circuit comprises:
   a current monitor circuit operative to sense a supply current of the at least one sensing memory circuit; and
   a controller coupled with the sensing memory circuit and with the current monitor circuit, the controller being operative to perform a write/read test of the sensing memory circuit, and to selectively provide the output signal indicating detection of a single event latchup condition in the at least one sensing circuit based on the write/read test if the sensed supply current is greater than or equal to a predetermined threshold.

14. The integrated circuit of claim 13, wherein the controller is operative to perform an initial write/read test of the sensing memory circuit if the sensed supply current is greater than or equal to the predetermined threshold, and if the initial write/read test fails, to perform a subsequent write/read test, and to selectively provide the output signal indicating detection of a single event latchup condition in the at least one sensing circuit based on the subsequent write/read test.

15. A method for operating an integrated circuit, comprising the steps of:
   detecting a single event latchup condition in at least one sensing circuit of the integrated circuit induced by an ion of a specific and predetermined LET, wherein the sensing circuit is configured for detection of specific level of ion SEL by adjusting the tap density of the substrate, the temperature of the exposure detection circuit, the substrate resistance, substrate doping or any combination thereof; and
   automatically disabling operation of a user circuit of the integrated circuit responsive to detection of the single event latchup condition in the at least one sensing circuit.

16. The method of claim 15, further comprising:
   providing to the at least one sensing circuit a supply that is higher than a voltage supplied to a corresponding circuit in the user circuit.

17. A method of forming an integrated circuit, comprising the steps of:
   forming at least one user circuit in at least one substrate;
   forming at least one sensing circuit in the at least one substrate, the at least one sensing circuit being sensitive to single event latchup in response to a single exposure to ionic radiation of the integrated circuit at a predetermined linear energy transfer level LET, wherein the sensing circuit is configured for detection of specific level of ion LET by adjusting the tap density of the substrate, the temperature of the exposure detection circuit, the substrate resistance, substrate doping or any combination thereof;
   forming an exposure detection circuit in the at least one substrate, the exposure detection circuit operative to sense a single event latchup condition in the at least one sensing circuit, and to provide an output signal in response to detection of a single event latchup condition in the at least one sensing circuit; and
   forming a deactivation circuit in the at least one substrate, the deactivation circuit coupled to receive the output signal from the exposure detection circuit and operative to selectively disable operation of the at least one user circuit responsive to the output signal from the exposure detection circuit.

18. The method of claim 17, further comprising:
   forming taps in the at least one user circuit having a first tap density; and
   forming taps in the at least one sensing circuit, the at least one sensing circuit having a second tap density;
   wherein the first tap density is at least twice the second tap density.

19. The method of claim 17, wherein forming the at least one user circuit comprises doping at least a portion of the at least one substrate to establish a well or substrate resistance of the at least one user circuit, wherein forming the at least one sensing circuit comprises doping at least another portion of the at least one substrate to establish a well or substrate resistance of the at least one sensing circuit, and wherein the well or substrate resistance of the at least one sensing circuit is greater than the well or substrate resistance of the user circuit.

20. The method of claim 17, comprising forming at least one heating component in the at least one substrate to provide heat to at least a portion of the at least one sensing circuit during operation of the integrated circuit.

* * * * *